(12) United States Patent
Okazawa

(10) Patent No.: US 6,643,168 B2
(45) Date of Patent: Nov. 4, 2003

(54) NONVOLATILE MAGNETIC STORAGE DEVICE

(75) Inventor: Takeshi Okazawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/067,864

(22) Filed: Feb. 8, 2002

(65) Prior Publication Data
US 2002/0109172 A1 Aug. 15, 2002

(30) Foreign Application Priority Data
Feb. 13, 2001 (JP) .................... 2001-035860

(51) Int. Cl.⁷ ............................... G11C 11/15
(52) U.S. Cl. ....................... 365/173; 365/171
(58) Field of Search ................ 365/171, 173, 365/158, 157

(56) References Cited

U.S. PATENT DOCUMENTS 4,788,813 A  12/1988  Chow et al. ............. 437/225
4,944,836 A   7/1990  Beyer et al. ............. 156/645
5,946,227 A * 8/1999  Naji ....................... 365/171
6,169,686 B1 * 1/2001  Brug et al. ............... 365/171
6,385,082 B1 * 5/2002  Abraham et al. ......... 365/171

FOREIGN PATENT DOCUMENTS

| JP | 2000-82791    |   | 3/2000  |
|----|---------------|---|---------|
| JP | 2000-195250   |   | 7/2000  |
| JP | 2000-353791 A |   | 12/2000 |
| JP | 2001-237472 A |   | 8/2001  |
| JP | 2002-26281 A  |   | 1/2002  |

* cited by examiner

Primary Examiner—Tan T. Nguyen
(74) Attorney, Agent, or Firm—Sughrue Mion, PLLC

(57) ABSTRACT

A magnetic memory device of the present invention includes a first wiring conductor having a first ability to flow a current therethrough, a second wiring conductor having a second ability larger than the first ability to flow a current therethrough, a magnetic memory cell having a pinned magnetic layer coupled to the second wiring conductor, a free magnetic layer coupled to the first wiring conductor and a non-magnetic layer sandwiched between the first and second magnetic layers. The first wiring conductor is made by aluminum and the second wiring conductor is made by copper.

19 Claims, 13 Drawing Sheets

NONVOLATILE MAGNETIC STORAGE DEVICE

BACKGROUND OF THE INVENTION

1. Field of the Invention

The present invention relates to an electrically programmable nonvolatile storage device, and more particularly, to a nonvolatile magnetic memory device.

2. Description of a Related Art

In a nonvolatile magnetic memory device of this kind, each memory cell has a magnetic tunneling junction (MTJ) formed by interposing a thin insulating layer between a pair of ferromagnetic layers. When a voltage is applied between the two ferromagnetic layers, electrons in one of the ferromagnetic layers enters the other by passing through the insulating layer by quantum mechanical tunneling. Thus, a "tunneling current" flows through the magnetic tunneling junction.

The electrical resistance of the magnetic tunneling junction changes according to the directions of magnetization of the two ferromagnetic layers. That is, the electrical resistance of the magnetic tunneling junction has a minimum value when the directions of magnetization of the two ferromagnetic layers are in parallel with each other, and has a maximum value when the directions of magnetization of the two ferromagnetic layers are in inverse parallel. Therefore, if the direction of magnetization of one of the ferromagnetic layers is changed by an applied magnetic field (external magnetic field) while the direction of magnetization of the other ferromagnetic layer is fixed, the electrical resistance value of the magnetic tunneling junction changes according to the direction of the applied magnetic field. That is, the value of the tunneling current changes. Thus, information is stored in each memory cell and read out (reproduced) from the cell by sensing the tunneling current value.

The thickness of each of the two ferromagnetic layers is freely selected, but it is necessary to set the thickness of the insulating layer to an extremely small value of about several nanometers since the quantum mechanical tunneling phenomenon is utilized.

For example, Japanese Patent Application Laid-open No. 2000-82791 discloses the principle of operation of Such a nonvolatile magnetic storage device.

Ordinarily, in a nonvolatile magnetic storage device of this kind, a multiplicity of memory cells each using the above-described magnetic tunneling junction are arranged in matrix form and upper and lower wiring layers are laid over and under the memory cells in substantially parallel with each other while being spaced apart at a predetermined distance from each other. The upper wiring layer formed of a low-electrical-resistance conductive material is patterned to form a plurality of bit lines in a predetermined configuration. Similarly, the lower wiring layer formed of a low-electrical-resistance conductive material is patterned to form a plurality of word lines in a predetermined configuration, which intersect the bit lines at right angles. The thus-formed nonvolatile magnetic storage device is called a magnetic random access memory (MRAM).

Each memory cell in the MRAM has two ferromagnetic layers. One is a storage layer having a direction of magnetization changed according to the direction of an external magnetic field. The storage layer is electrically connected to the corresponding bit line. The other layer is a pinned layer having a fixed direction of magnetization. The layer is electrically connected to the corresponding word line. When information is recorded (written) in a one of memory cells selected as desired, the word and bit lines electrically connected to the memory cell are selected and predetermined write currents are caused to flow respectively through the word and bit lines. These write currents induce magnetic fields around the word and bit lines according to the values of the write currents. The direction of magnetization of the upper ferromagnetic layer, i.e., the storage layer, changes according to a resultant magnetic field formed by the two induced magnetic fields.

If the direction of magnetization changed in this manner is the same as the direction of magnetization of the lower ferromagnetic layer, i.e., the free layer, of the same memory cell, the directions of the free layer and the storage layer are in parallel. If the changed direction of magnetization is opposite to the direction of magnetization of the free layer, the directions of the free layer and the storage layer are in inverse parallel. The direction of magnetization of the storage layer is thus changed to write binary information "0" or "1" in the selected cell.

To change the value written in the selected memory cell, one of the write currents caused to flow through the word and bit lines is reversed in direction (inverted). The direction of resultant magnetic field induced around the word and bit lines by the two write currents is thereby changed to reverse the direction of magnetization of the storage layer, i.e., to write the other value.

Ordinarily, in MRAMS, the upper wiring layer forming bit lines and the lower wiring layer forming word lines are formed of the same material, e.g., aluminum (Al), copper (Cu), or an alloy having Al or Cu as a major component. The upper and lower wiring layers are formed in this manner by considering the advantages of simplying the manufacture processing, limting the manufacturing cost, etc. However, the inventor of the present invention has found in conventional MRAMS problems described below.

Since the storage cells, the upper wiring (bit lines) and the lower wiring (word lines) are formed and placed as described above, the upper ferromagnetic layer (storage layer) on each memory cell is close to the upper wiring (bit line) and at some distance from the lower wiring (word line).

Generally, the intensity H of a magnetic field induced by a current at a distanced from a stright line along which the current flows in a space is proportional to the magnitude I of the current and inversely proportional to the distance d. That is, $H=kI/d$ (k: a constant). Therefore the intensity of a magnetic field induced in the upper ferromagnetic layer (storage layer) in one memory cell by the current flowing through the corresponding bit line is higher than that of a magnetic field induced by the current flowing through the corresponding word line. To equalize the intensities of the two induced magnetic fields, it is necessary to increase the current flowing through the word line relative to the current flowing through the bit line.

However, sicne the bit line and the word line are made by the same material, the long-term reliability of the word line having the larger current caused to flow therethrough in comparison with the bit line is reduced relative to that of the bit line.

SUMMARY OF THE INVENTION

It is an object of the present invention to provide a nonvolatile magnetic memory device in which the intensities of magnetic fields induced in a storage layer in a memory cell by currents flowing through two wiring conductors on the opposite sides of the memory cell can be made approximately equal to each other without any problem in terms of long-term reliability or layout.

It is another object of the present invention to provide a nonvolatile magnetic memory device in which the intensities of magnetic fields induced in a storage layer in a memory cell by currents flowing through two wiring conductors on the opposite sides of the memory cell can be made approximately equal to each other while maintaining the two wiring conductors in the state of being approximately equal to each other in sectional area.

It is still another object of the present invention to provide a nonvolatile magnetic storage device capable of using a design for an optimized memory cell.

A magnetic memory device of the present invention includes a first wiring conductor having a first ability to flow a current therethrough, a second wiring conductor having a second ability larger than the first ability to flow a current therethrough, a magnetic memory cell having a pinned magnetic layer coupled to the second wiring conductor, a free magnetic layer coupled to the first wiring conductor and a non-magnetic layer sandwiched between the first and second magnetic layers.

Japanese Patent Application Laid-open No. 2000-195250 discloses the same kind of nonvolatile magnetic storage device as the first nonvolatile magnetic storage device of the present invention. According to this publication, however, each of the bit lines and word lines in the nonvolatile magnetic storage device is formed of CuAu and only use of a low-resistance wiring material such as Cu or Al as an alternative material for forming the bit lines is mentioned.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENT

Figure 1:
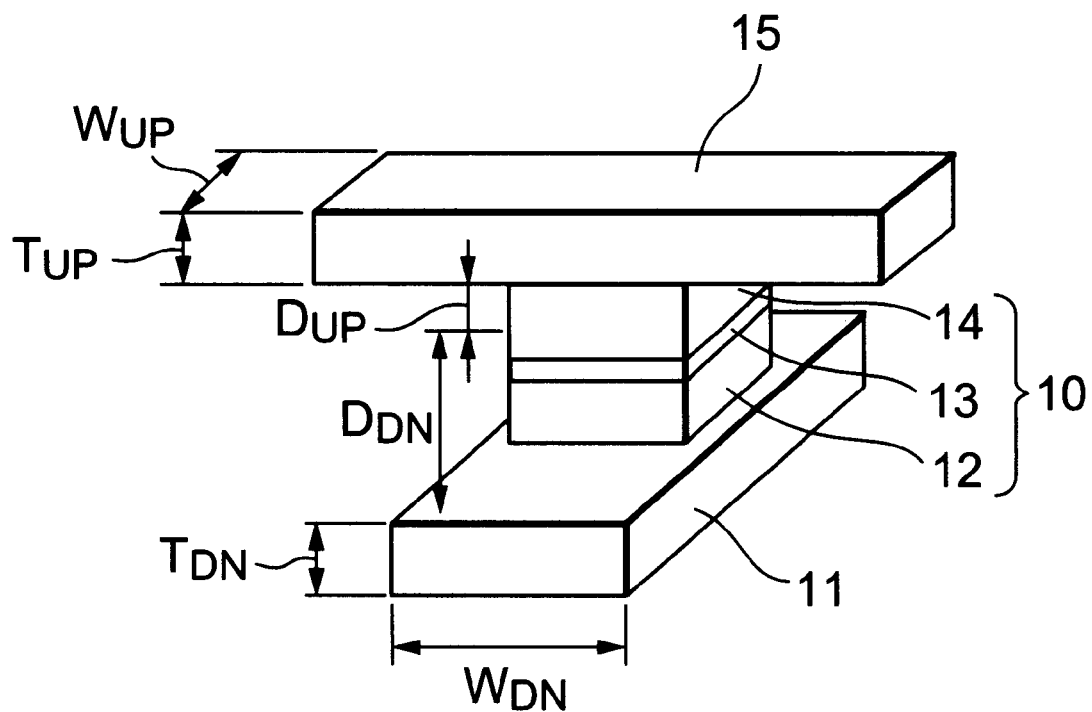
FIG. 1 is a schematic perspective view of the construction of a memory cell used in a MRAM in a first embodiment of the present invention.

FIG. 1 schematically shows the construction of a memory cell 10 of a nonvolatile magnetic memory device (hereinafter referred to as MRAM) according to a first embodiment of the present invention. The memory cell 10 is placed between a lower wiring conductor 11 (which functions as a word line) and an upper wiring conductor 15 (which functions as a bit line) and has a structure in which a pinned ferromagnetic layer 12 (about 20 nm thick), a non magnetic layer such as an insulating layer 13 (about 1.5 nm thick) and a free ferromagnetic storage layer 14 (about 20 nm thick) are laid one on another in this order. The lower surface of the layer 12 is in contact with the upper surface of the lower wiring conductor 11. The layer 12 is electrically connected to the lower wiring conductor 11. The upper surface of the storage layer 14 is in contact with the lower surface of the upper wiring conductor 15. The storage layer 14 is electrically connected to the upper wiring conductor 15. The layer 12 and the storage layer 14 are electrically insulated from each other by the insulating layer 13. The cell is a tunnel magnetoresistance (TMR) memory cell.

Each of the layers 12 to 14, that is, the cell 10, has the shape of substantially square along a direction perpendicular to the direction flowing a current between the wirings 11 and 15. The substantially square means that the ratio of short side and longer side of one of layers 12 to 14 in its plain view is 1:1 to 1.2.

The materials of the ferromagnetic layer 12 and the ferromagnetic storage layer 14 are not limited to particular materials. Each of the layers 12 and 14 can be made of a ferromagnetic material freely selected. For example, each of the layers 12 and 14 may be made of Co, $Co_{50}Fe_{50}$, $CrO_2$, or $Fe_3O_4$. Also, the material of the insulating layer 13 is not limited to a particular material. For example, it is $AlO_3$.

In this embodiment, the lower wiring conductor 11 is made of copper (Cu) and the upper wiring conductor 15 is made of aluminum (Al). The electrical sheet resistance of copper is about 40 $\Omega m/\square$ and the electrical sheet resistance of aluminum is about 100 $\Omega m/\square$. Therefore, if this structure is designed so that the width $W_{DN}$ and the thickness $T_{DN}$ of the lower wiring conductor 11 are respectively equal to the width $W_{UP}$ and the thickness $T_{UP}$ of the upper wiring conductor 15 (that is, $W_{DN}=W_{UP}$, $T_{DN}=T_{UP}$), a current allowed to flow through the lower wiring conductor 11 is about 2.5 times larger than that allowed to flow through the upper wiring conductor 15. Correspondingly, the maximum intensity of a magnetic field induced by the current flowing through the lower wiring conductor 11 is about 2.5 times higher than that of a magnetic field induced by the current flowing through the upper wiring conductor 15. In other words, the maximum intensity of a magnetic field induced in a place at a certain distance from the upper wiring conductor 15 by the current flowing through the upper wiring conductor 15 is substantially equal to that of the magnetic field induced in a place at a distance from the lower wiring conductor 11 about 2.5 times larger than the distance from the upper wiring conductor 15 by the current flowing through the lower wiring conductor 11.

The lower wiring conductor 11 made of the electroconductive material comprising copper has, while having a current flowing therethrough, long-term reliability, i.e., resistance to so-called "electromigration", higher by about an order of magnitude than that of the upper wiring conductor 15 made of aluminum. Therefore, even though the current about 2.5 times larger than that caused to flow through the upper wiring conductor 15 is caused to flow through the lower wiring conductor 11, the possibility that a problem of long-term reliability will arise is low. The memory cell 10 having the above-described construction operates as described below.

The memory cell 10 shown in FIG. 1 has a "magnetic tunneling junction (MTJ)" formed by interposing the thin insulating layer 13 between the ferromagnetic layer 12 and the ferromagnetic storage layer 14. Writing binary information "0" or "1" to the memory cell 10 is performed as described below.

Figure 2:
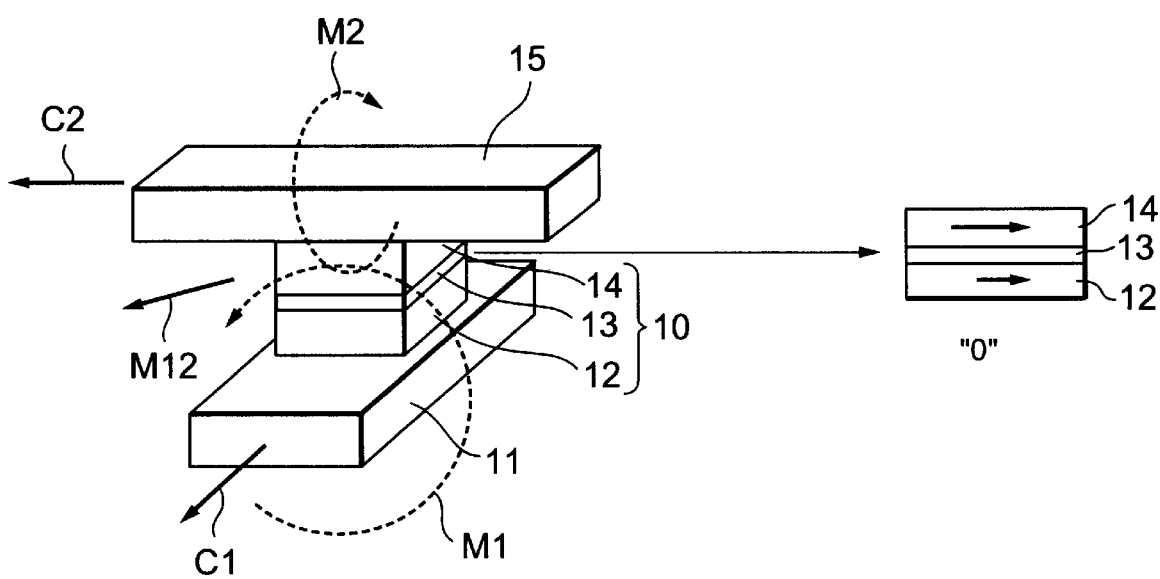
FIG. 2 is a schematic perspective view of the memory cell shown in FIG. 1, showing a method of writing information of a value "0" to the memory cell.

When a value "0" is stored in the memory cell 10, a write current C1 is caused to flow through the lower wiring conductor 11 in a downward direction as viewed in FIG. 2 and a write current C2 is simultaneously caused to flow through the upper wiring conductor 15 in a direction indicated in FIG. 2. Since the lower wiring conductor 11 and the upper wiring conductor 15 are electrically insulated by the insulating layer 13, there is no electrical problem therebetween.

A magnetic field M1 is induced around the lower wiring conductor 11 by the write current C1, while a magnetic field M2 is induced around the upper wiring conductor 15 by the write current C2. The direction of a resultant magnetic field M12 is formed by the two magnetic fields M1 and M2 as indicated in FIG. 2 in a plane parallel to the lower wiring conductor 11 and the upper wiring conductor 15. As a result, the direction of magnetization of the storage layer 14 in the memory cell 10 is the same as the direction of magnetization of the layer 12, i.e., in parallel with the same, as shown in FIG. 2. The direction of magnetization of the layer 12 is fixed as shown in FIG. 2 by magnetic exchange coupling with another ferromagnetic layer (not shown) or by any other method.

Figure 3:
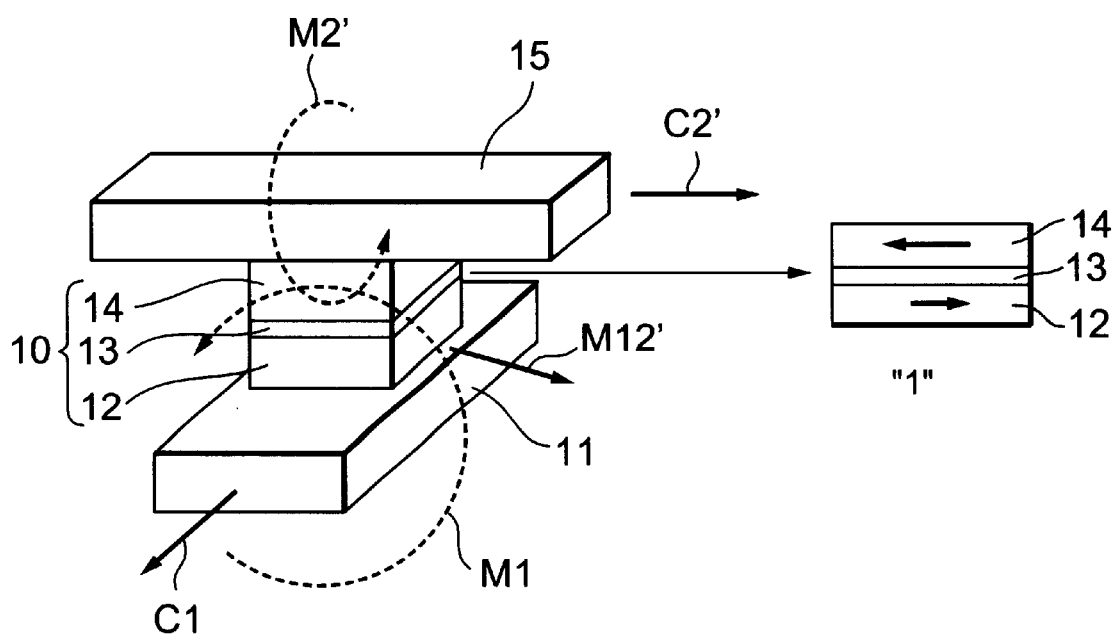
FIG. 3 is a schematic perspective view of the memory cell shown in FIG. 1, showing a method of writing information of a value "1" to the memory cell.

When a value "1" is stored in the memory cell 10, the write current C1 is caused to flow through the lower wiring conductor 11 as shown in FIG. 3 and a write current C2' is simultaneously caused to flow through the upper wiring conductor 15 in a direction indicated in FIG. 3. The direction of the write current C2' is opposite to that of the write current C2 shown in FIG. 2. While the magnetic field M1 is induced around the lower wiring conductor 11, a magnetic field M2' in the direction opposite to that of the magnetic field M2 is induced around the upper wiring conductor 15 by the write current C2'. The direction of a resultant magnetic field M12' is formed by the two magnetic fields M1 and M2' as indicated in FIG. 3 in a plane parallel to the lower wiring conductor 11 and the upper wiring conductor 15. The direction of the resultant magnetic field M12' shown in FIG. 3 corresponds to the direction determined by rotating the direction of the resultant magnetic field M12 showing in FIG. 2 by 90 degrees in the plane parallel to the lower wiring conductor 11 and the upper wiring conductor 15. As a result, the direction of magnetization of the storage layer 14 of the memory cell 10 is opposite to that of the layer 12, i.e., in inverse parallel with the same, as shown in FIG. 3.

The value "0" or "1" can be stored in the memory cell 10 in the above-described manner.

Needless to say, while the method of reversing the direction of write current C2 while fixing the direction of write current C1 has been described, the method of reversing the direction of write current C1 while fixing the direction of write current C2 may alternatively be used to obtain the same effect.

Figure 4:
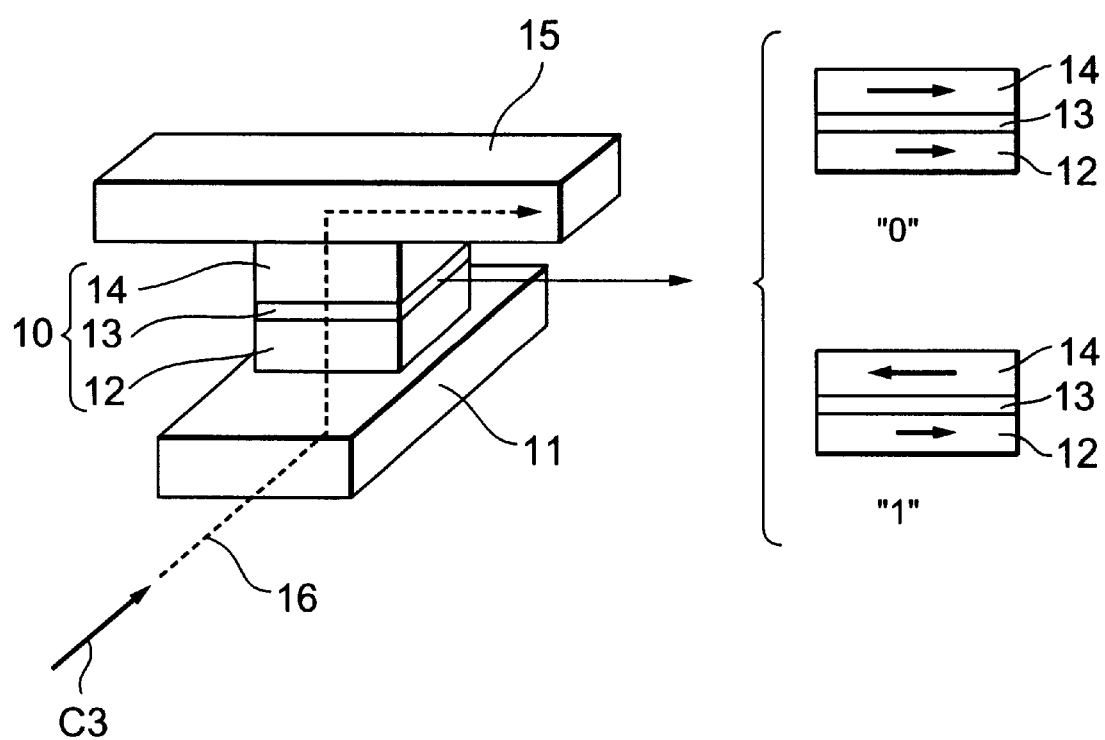
FIG. 4 is a schematic perspective view of the memory cell shown in FIG. 1, showing a method of reading out information written to the memory cell.

Information having the value "0" or "1" is read out (reproduced) as described below. As shown in FIG. 4, a predetermined voltage is applied between the lower wiring conductor 11 and the upper wiring conductor 15 to cause a read current C3 to flow from the lower wiring conductor 11 to the upper wiring conductor 15 by passing through the memory cell 10. The read current C3 flows along a path 16 such as that shown in FIG. 4. The direction of the read current C3 may be opposite to that indicated in FIG. 4.

In this case, the voltage applied between the lower wiring conductor 11 and the upper wiring conductor 15 acts on the insulating layer 13 through the layer 12 and the storage layer 14. Quantum mechanical tunneling is thereby caused in the insulating layer 13 to allow electrons in the storage layer 14 to enter the layer 12 by passing through the insulating layer 13. Thus, a "tunneling current" flows by passing through the insulating layer 13. The electrical resistance of the memory cell 10 is a function of the tunneling current. Also, the electrical resistance value of the memory cell 10 changes according to the direction of magnetization of the storage layer 14 and the layer 12. That is, the electrical resistance of the memory cell 10 is minimum when the directions of magnetization of the storage layer 14 and the layer 12 are in parallel (when the stored value is "0"), and it is maximum when the directions of magnetization of the storage layer 14 and the layer 12 are in inverse parallel (when the stored value is "1").

Thus, reading (reproduction) of information stored in the memory cell 10 is performed by sensing the value of the tunneling current through the memory cell 10, i.e., the read current C3. It is said that the electrical resistance of the insulating layer 13 varies by 10 to 40% between the condition in which the value of information stored in the storage layer 14 is "0" and the condition in which the value of information stored in the storage layer 14 is "1".

In this memory cell 10, information is recorded by using induced magnetic fields and is reproduced by using the "tunneling MR effect". Thus, each of writing of information to be stored and reading of stored information can be performed through the lower wiring conductor 11 and the upper wiring conductor 15. Therefore there is no need for an electrode for reading out stored information, such as that in a device using a giant magnetoresistance (GMR) effect, and the electrode structure can be simplified in comparison with the case of using GMR.

The MRAM which is constructed by using the memory cell 10 having the construction shown in FIG. 1 and which represents an embodiment of the present invention will now be described with reference to FIG. 5.

Figure 5:
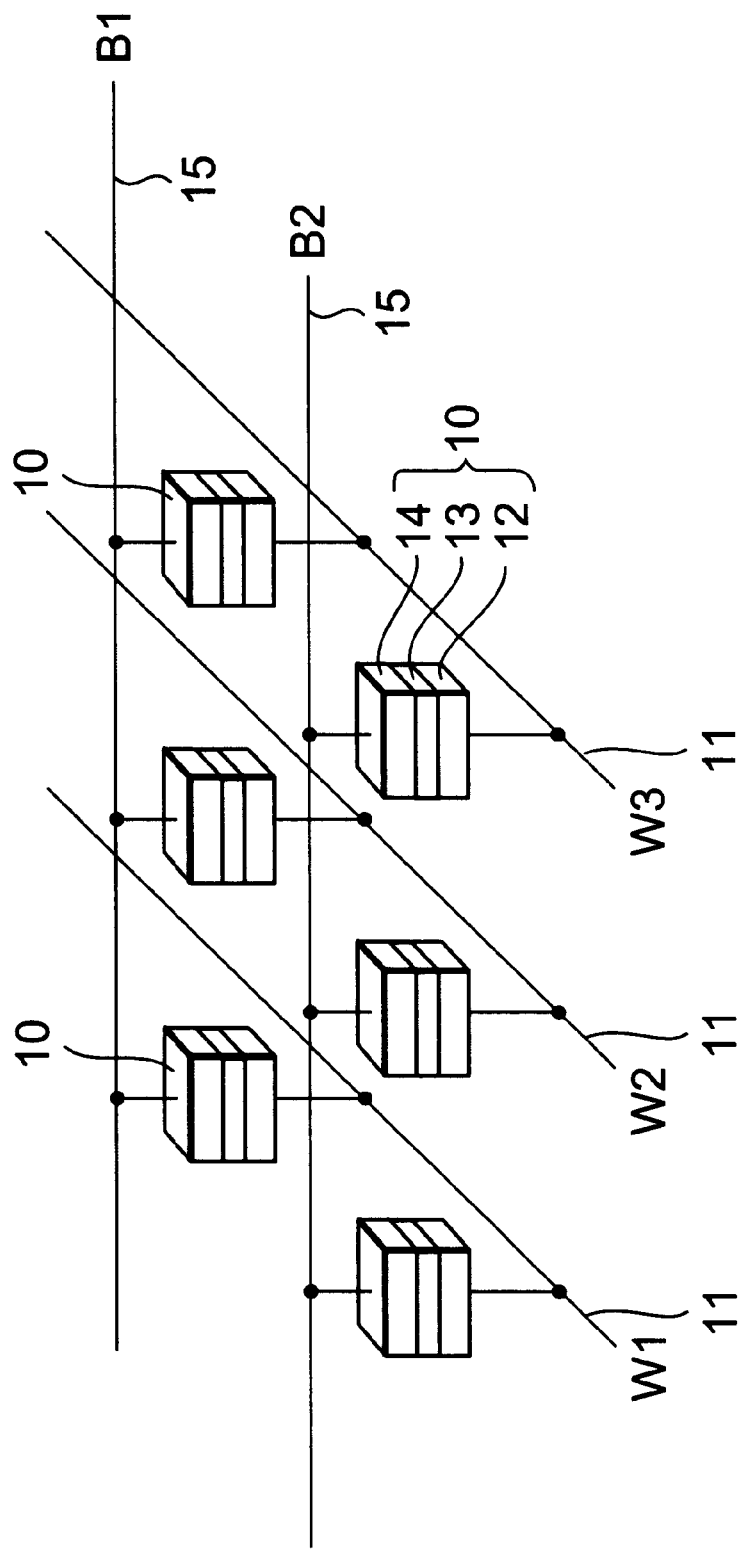
FIG. 5 is a schematic perspective view of the construction of the MRAM in the embodiment of the present invention.

As shown in FIG. 5, the MRAM has a plurality of lower wiring conductors 11 arranged parallel to each other in one layer (lower wiring layer) with a predetermined spacing set therebetween. The MRAM also has a plurality of upper wiring conductors 15 arranged parallel to each other in one layer (upper wiring layer) with a predetermined spacing set therebetween. The lower wiring layer and the upper wiring layer are spaced apart from each other in the top-bottom direction by a predetermined distance. The direction in which the plurality of lower wiring conductors 11 extend is perpendicular to the direction in which the plurality of upper wiring conductors 15 extend. Thus, the lower wiring conductors 11 and the upper wiring conductors 15 form a matrix. The plurality of lower wiring conductors 11 are respectively used as word lines W1, W2, W3, . . . . The plurality of upper wiring conductors 15 are respectively used as bit lines B1, B2, The word lines are coupled to a row decoder and a first current power source circuit (not shown). The row decoder selects one of word lines in response to a row address. The first current supply circuit supplies a write current or read current to the selected word line. The bit lines are coupled to a column decoder and a second current supply circuit (not shown). The column decoder selects one of bit lines in response to a column address. The second current supply circuit supplies a write current to the selected bit line.

The plurality of memory cells 10 are placed at each of the points of intersection of the lower wiring conductors 11 (word lines) and the upper wiring conductors 15 (bit lines). Thus, the memory cells 10 are also arranged in matrix.

Figure 6:
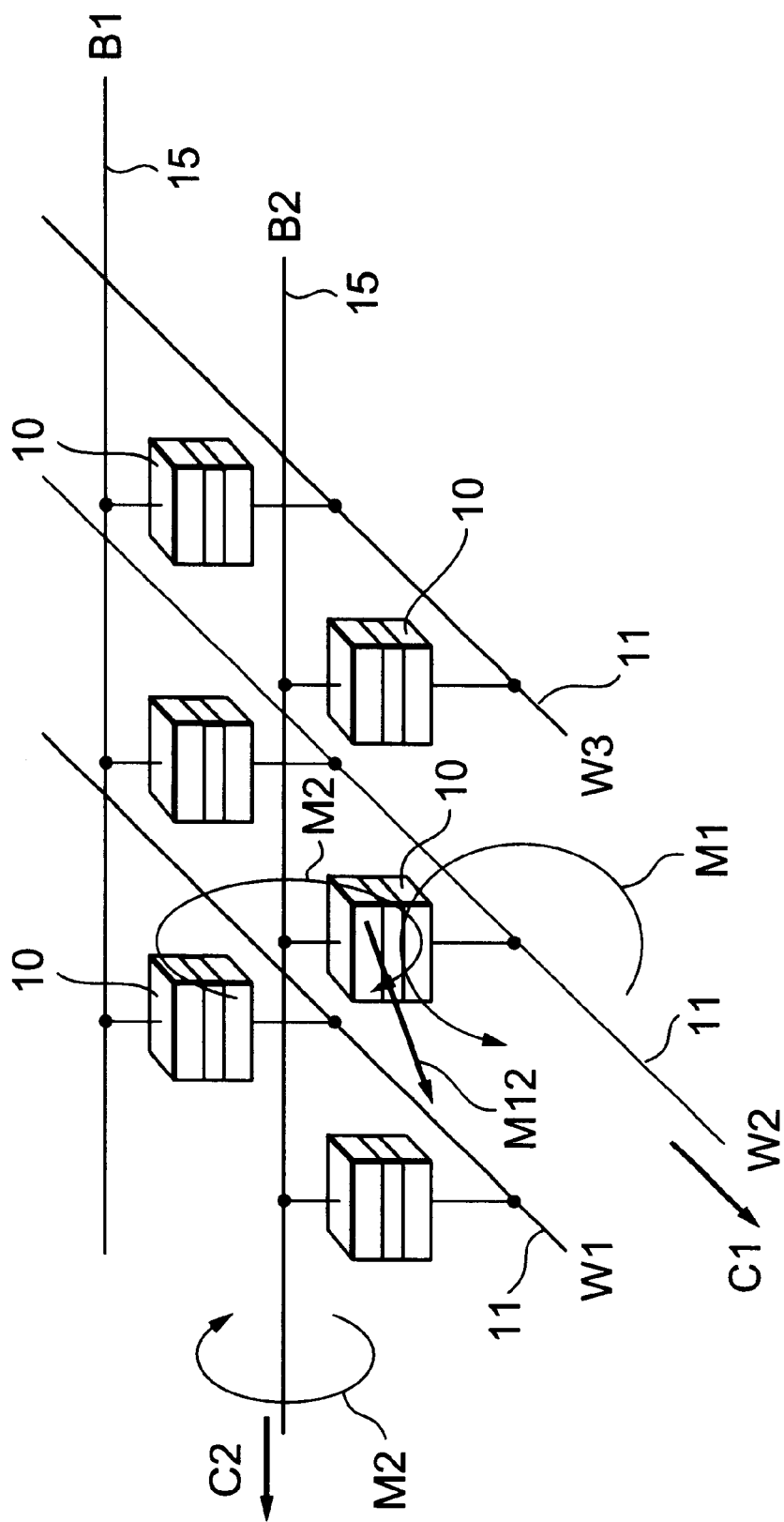
FIG. 6 is a schematic perspective view of the MRAM in the embodiment of the present invention, showing the operation of the MRAM.

To designate one of the memory cells 10 selected to write information thereto or to read information therefrom, one of the plurality of lower wiring conductors 11 (i.e., word lines W1, w2, W3, . . . ) is selected and one of the plurality of upper wiring conductors 15 (i.e., bit lines B1, B2, B3, . . . ) is also selected simultaneously. In this manner, any desired memory cells 10 can easily be designated. Writing of information of the value "0" to the memory cell 10 designated may be performed by simultaneously supplying write current C1 to the selected lower wiring conductor 11 (word line W2) and write current C2 to the selected upper wiring conductor 15 (bit line B2), as shown in FIG. 6. Writing of information of the value "1" may be performed by simultaneously supplying write current C1 to the selected lower wiring conductor 11 (word line W2) and write current C2' in the direction opposite to that of write current C2 to the selected upper wiring conductor 15 (bit line B2). Also, reading of information from the designated memory cell 10 may be performed by causing read current C3 to flow through the selected lower wiring conductor 11 (word line) and the selected upper wiring conductor 15 (bit line) by passing through the memory cell 10, as described above with reference to FIG. 4.

A method of manufacturing the MRAM in the first embodiment of the present invention, which is constructed by using the memory cell 10 having the construction shown in FIG. 1, will next be described with reference to FIGS. 7A to 7I. For ease of description, fabrication of only two memory cells 10 will be described, although a plurality of memory cells are actually fabricated.

Figure 7A:
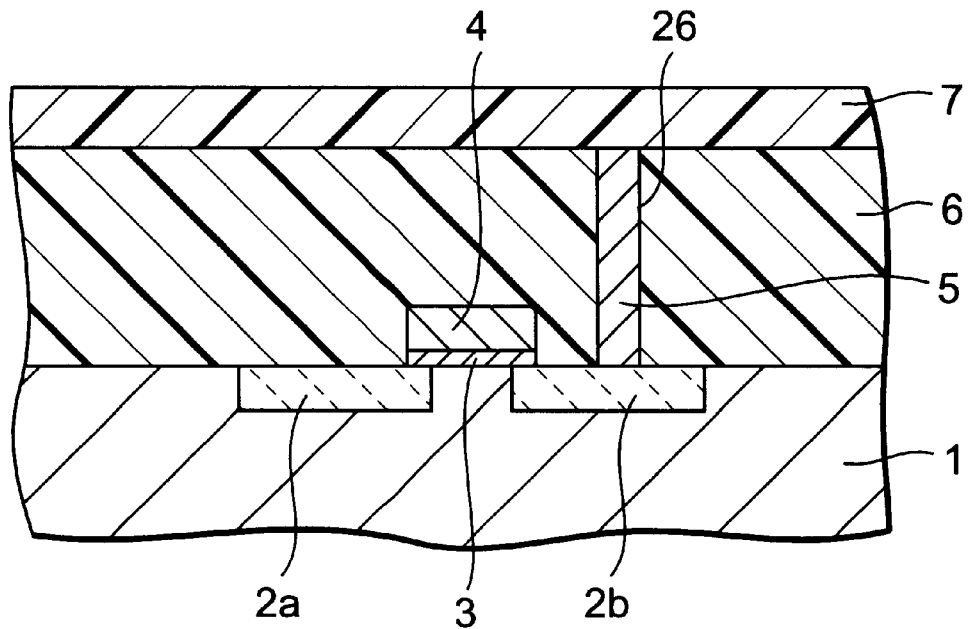
FIGS. 7A and 7I are schematic sectional views of an essential portion of the MRAM in the embodiment of the present invention, showing steps in the process of manufacturing the MRAM.

First, as shown in FIG. 7A, an n-type (or p-type) source region 2a and an n-type (or p-type) drain region 2b are formed in a major surface of a p-type (or n-type) semiconductor substrate 1. Between the source region 2a and the drain region 2b, a gate insulating film 3 is formed on the major surface of the semiconductor substrate 1. Further, a gate electrode 4 is formed on the gate insulating film 3 by. Thereafter, a first interlayer insulating film 6 is formed on the major surface of the semiconductor substrate so as to cover the gate insulating film 3 and the gate electrode 4. The first interlayer insulating film 6 covers the entire surface of the semiconductor substrate 1.

Next, a contact hole 26 is formed through the first interlayer insulating film 6, and the space in the contact hole 21 is filled with a conductive material to form a contact plug 5. The lower end of the contact plug 5 is in contact with the drain region 2b. The contact plug 5 is used to establish an electrical connection between the drain region 2b and the memory cell 10 formed in a step performed afterward.

A second interlayer insulating film 7 is formed on the first interlayer insulating film 6. The second interlayer insulating film 7 extends over the entire surface of the semiconductor substrate 1. The state when this step is completed is as shown in FIG. 7A.

Subsequently, lower wiring conductors 11 are formed on the second interlayer insulating film 7 as described below. Lower wiring conductors 11 are formed of copper (Cu) in this example.

Figure 7B:
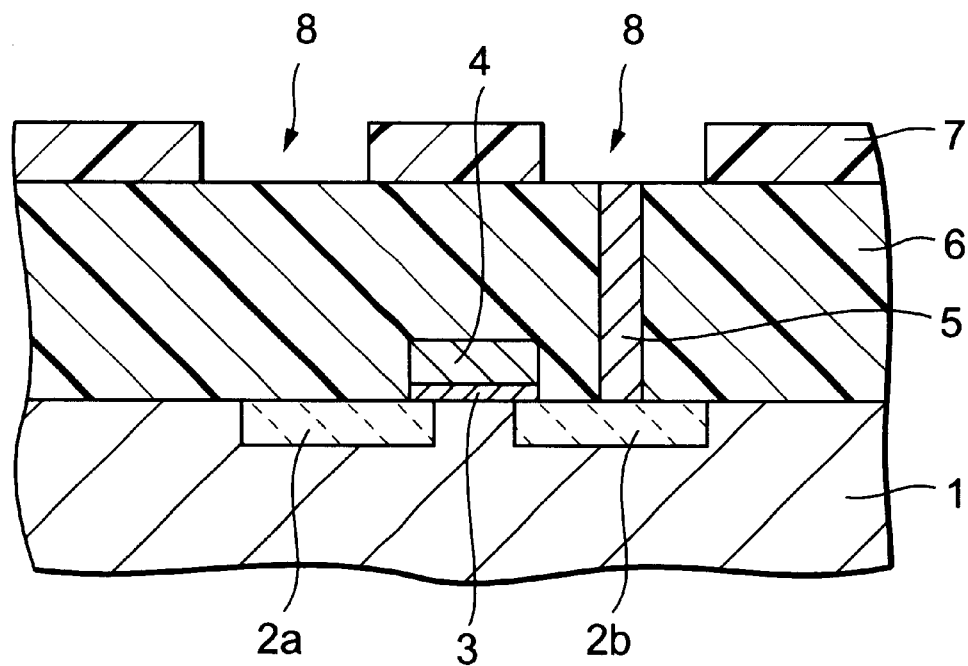

As shown in FIG. 7B, the second interlayer insulating film 7 is selectively removed by ordinary photolithography and dry etching to form a plurality of openings 8 for forming lower wiring conductors 11. One of the openings 8 is superposed on the contact plug 5. In this opening 8, the surface of the second interlayer insulating film 7 and the upper end of the contact plug 5 are exposed. For example, the second interlayer insulating film 7 is formed of $SiO_2$.

Figure 7C:
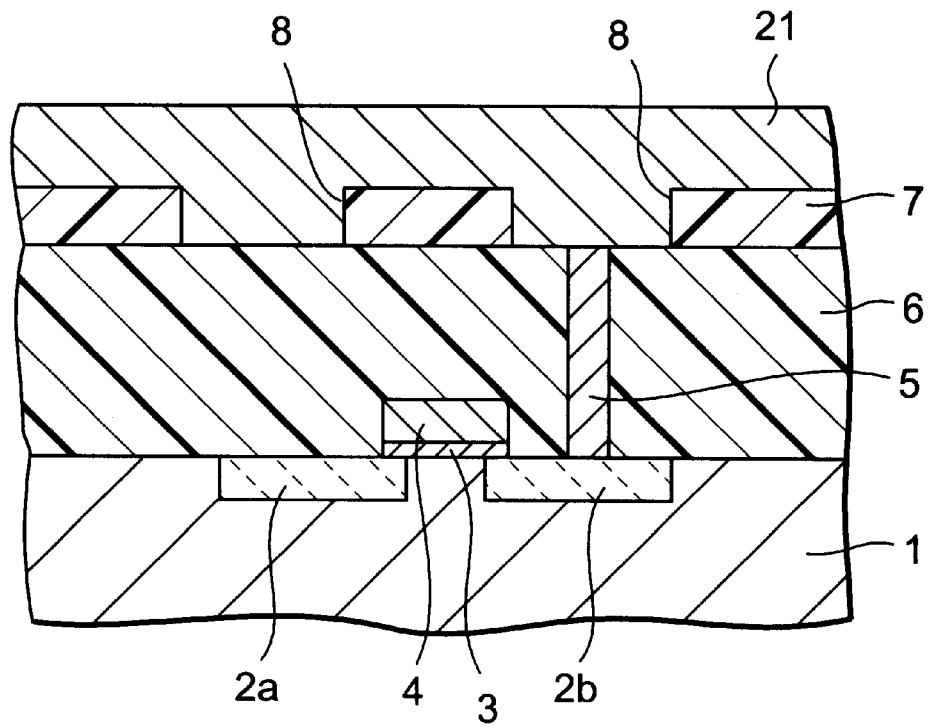

Next, a copper film 21 is formed on the second interlayer insulating film 7 by, for example, sputtering or chemical vapor deposition (CVD), as shown in FIG. 7C. The thickness of the copper film 21 is set to a value large enough to embed each of the entire openings 8. The copper film 21 extends over the entire surface of the semiconductor substrate 1.

Figure 7D:
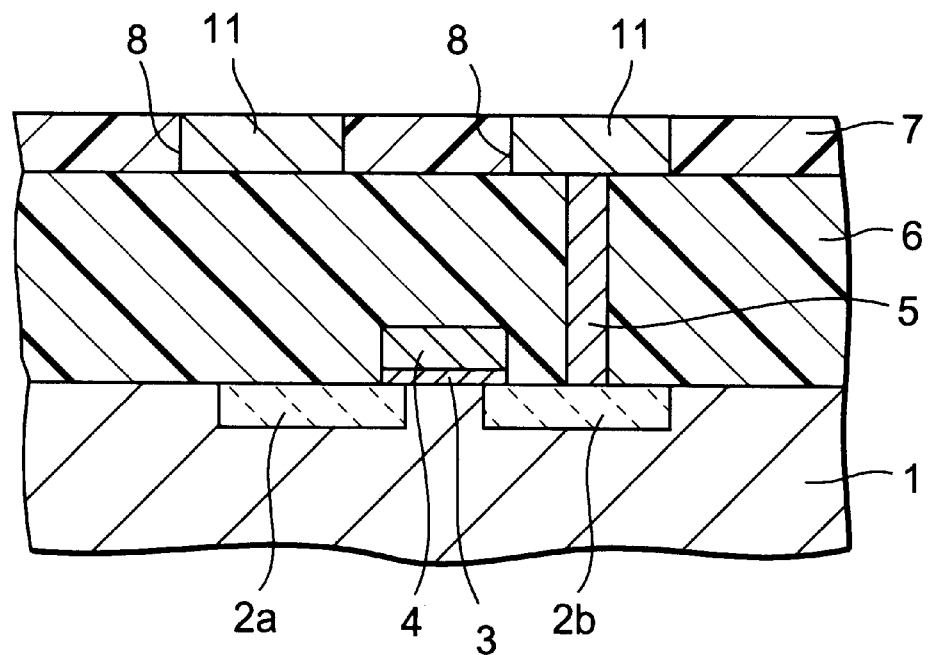

The copper film 21 is polished by chemical mechanical polishing (CMP) to selectively remove the portions of the copper film 21 above the level corresponding to the upper ends of each of the openings 8, thereby leaving copper film 21 only in the openings 8. The copper films 21 remaining in the openings 8 form lower wiring conductors 11. The upper ends of the copper films 21 remaining in the openings 8 are substantially flush with the surface of the second interlayer insulating film 7. This method is called a "damascene" method and has the advantage of obtaining wiring in a desired pattern by avoiding a problem that copper film 21 cannot be patterned as desired by a combination of lithography and etching because of its properties. The state when this processing is completed is as shown in FIG. 7D.

For example, U.S. Pat. Nos. 4,789,648 and 4,944,836 disclose methods of forming wiring by CMP.

Figure 7E:
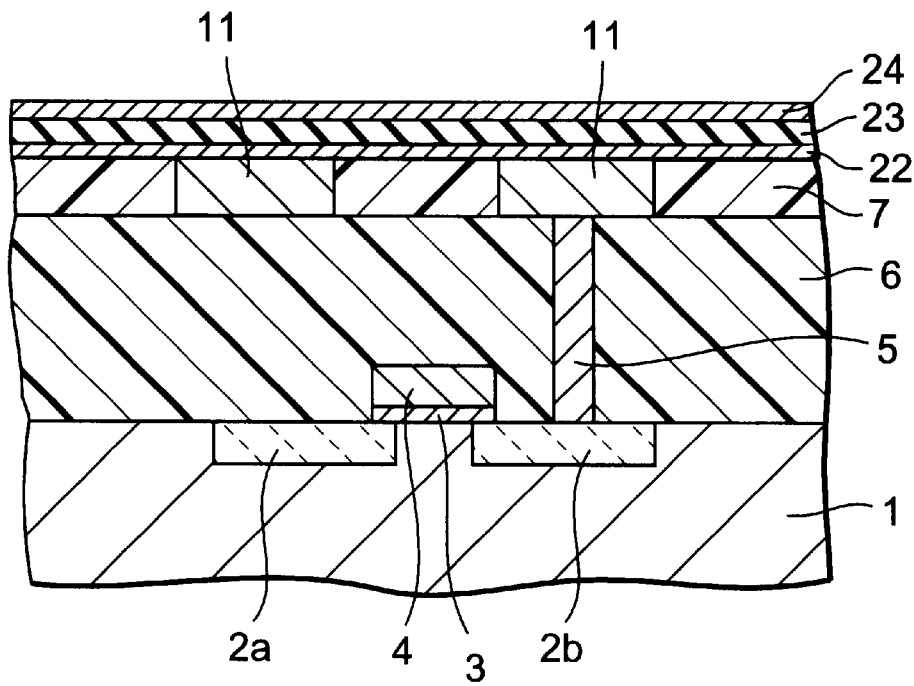
Figure 7F:
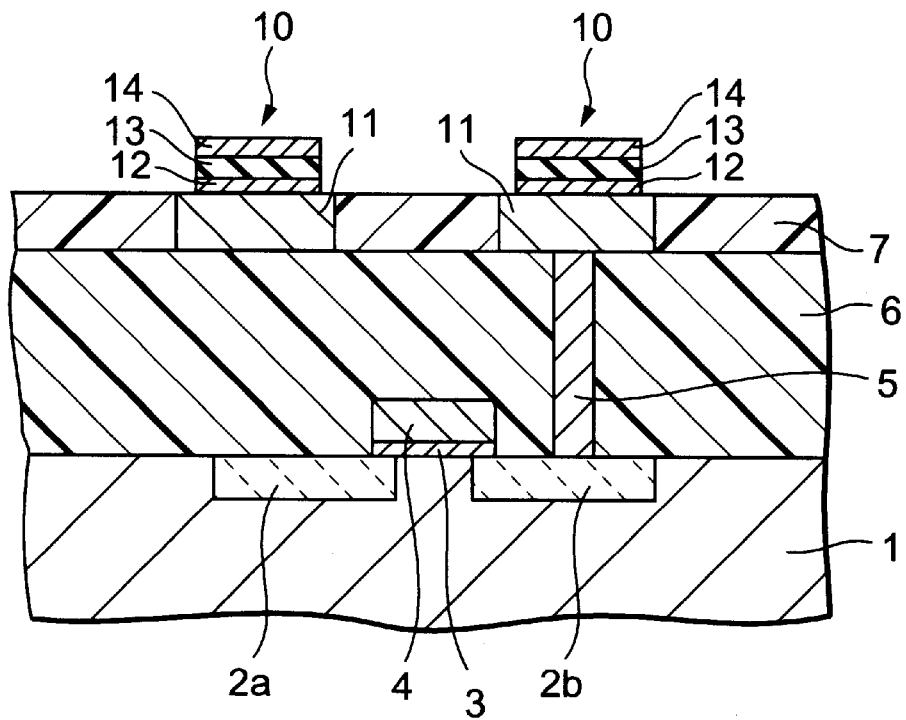

Subsequently, as shown in FIG. 7E, a ferromagnetic metal layer 22 having a thickness of about 20 nm, an insulating layer 23 having a thickness of about 1.5 nm and a ferromagnetic metal layer 24 having a thickness of about 20 nm are successively formed on the second interlayer insulating film 7 having the lower wiring Cu conductors 11 embedded therein by, for example, sputtering or CVD. The laminate formed of the ferromagnetic metal layer 22, the insulating layer 23 and the ferromagnetic metal layer 24 is selectively removed by a photolithography and dry etching, as shown in FIG. 7F. The remaining laminate portions are respectively located on the lower wiring conductors 11. That is, each lower ferromagnetic metal layer 22 is in contact with the lower wiring conductor 11 (word line).

Figure 7G:
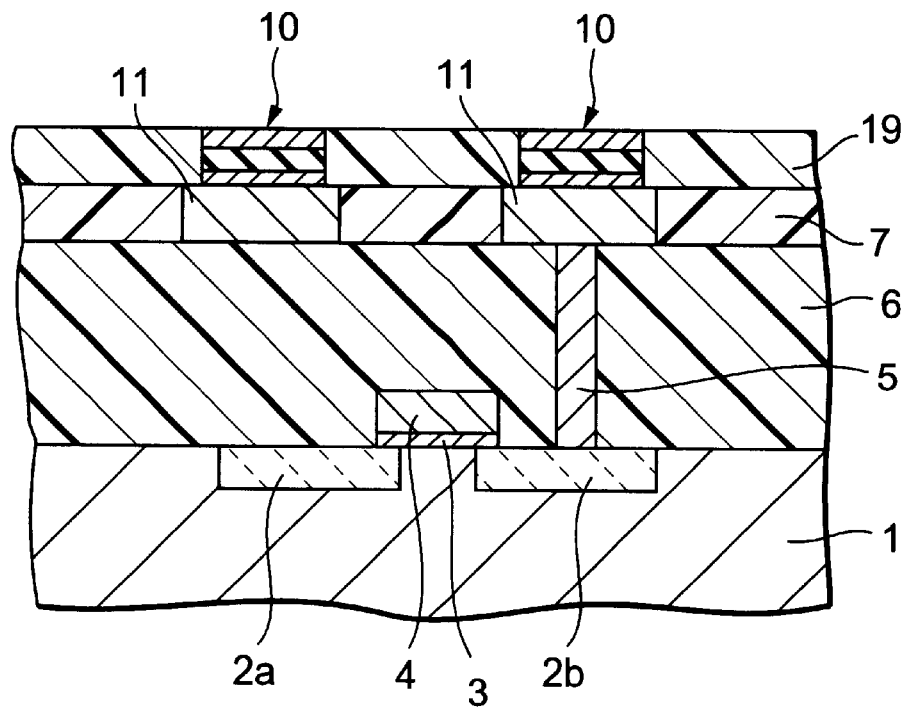

Subsequently, as shown in FIG. 7G, a third interlayer insulating film 19 is formed on the second interlayer insulating film 7. For example, the third interlayer insulating film 19 is formed of $SiO_2$. The third interlayer insulating film 19 is formed on the second interlayer insulating film 7 between the laminates formed of the ferromagnetic metal layer 22, the insulating layer 23 and the ferromagnetic metal layer 24. The upper ends of the laminates are substantially flush with the surface of the third interlayer insulating film 19. This structure can be realized by using the above-mentioned damascene method. That is, the third interlayer insulating film 19 is formed on the second interlayer insulating film 7 so as to cover the laminates formed of the ferromagnetic metal layer 22, the insulating layer 23 and the ferromagnetic metal layer 24 and, thereafter, the third interlayer insulating film 19 is polished by CMP to be selectively removed. The portions of the third interlayer insulating film 19 above the level corresponding to the upper ends of the laminates are thereby polished and removed. The state when this processing is completed is as shown in FIG. 7G.

Figure 7H:
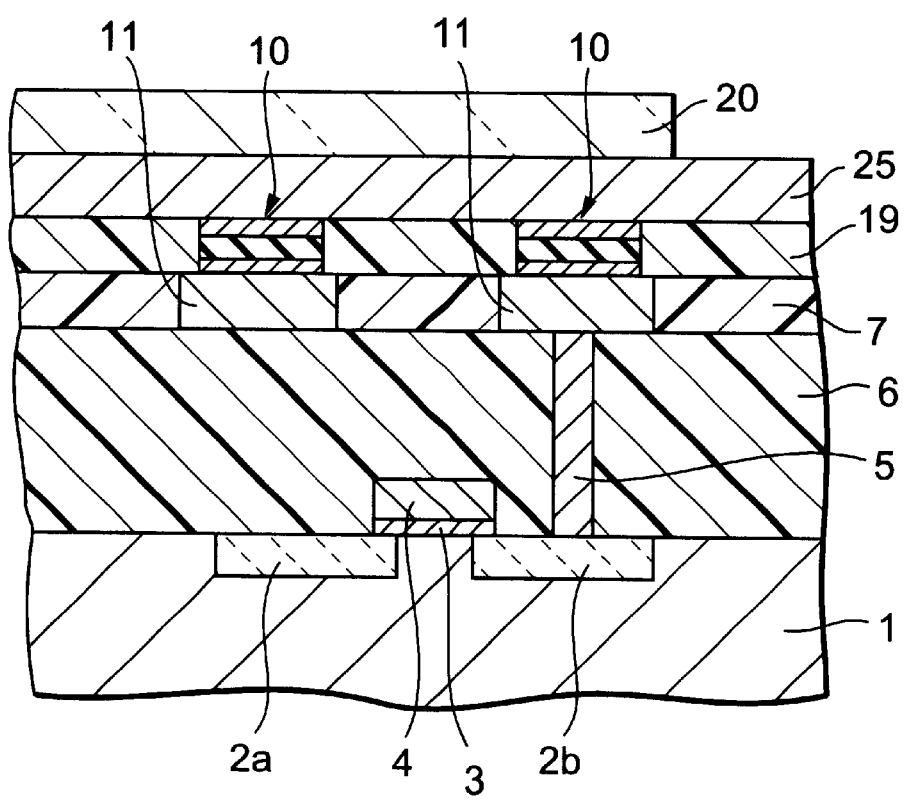
Figure 7:
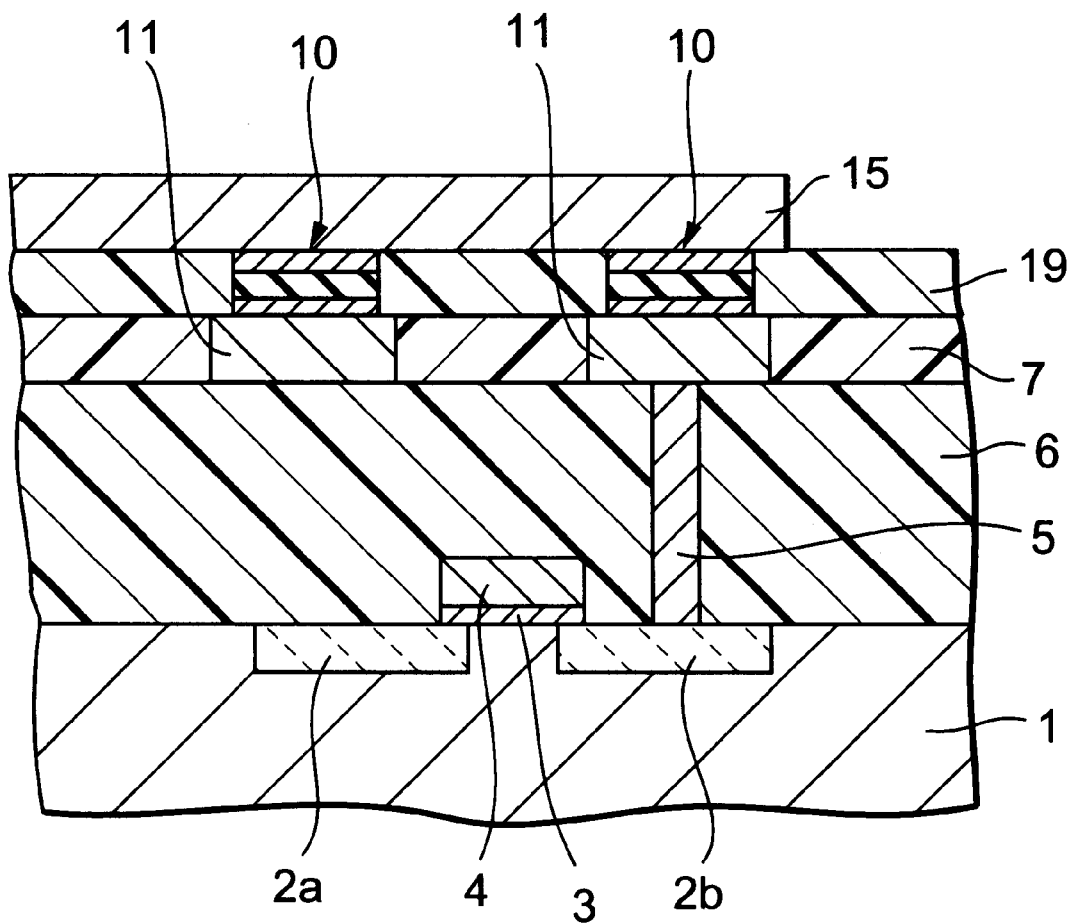

Further, as shown in FIG. 7H, an aluminum film 25 is formed on the third interlayer insulating film 19 in which the laminates formed of the ferromagnetic metal layer 22, the insulating film 23 and the ferromagnetic metal layer 24 are embedded. At this time, the aluminum film 25 contacts the ferromagnetic metal layer 24 exposed in the surface of the third interlayer insulating film 19. Thereafter, a photoresist film 20 is formed on the aluminum film 25 and is patterned by ordinary photolithography. The aluminum film 25 is selectively removed by dry etching using the patterned photoresist film 20 as a mask. Each of the upper wiring conductors 15 is formed by the aluminum film remaining on the third insulating film 19 after this etching. The state when this processing is completed is as shown in FIG. 7I.

By the above-described process, the MRAM having memory cells 10 shown in FIG. 1 and having the construction shown in FIG. 5 is manufactured.

As can be clearly understood from the foregoing, the MRAM in the embodiment of the present invention has a plurality of lower wiring conductors 11 formed of copper (Cu) and a plurality of upper wiring conductors 15 formed of aluminum (Al). That is, the lower wiring conductors 11 are formed of the conductive material Cu lower in specific resistance and higher in long-term reliability than the conductive material Al of the upper wiring conductors 15. It is, therefore, possible to increase the current flowing through each lower wiring conductor 11 relative to that flowing through the upper wiring conductor 15 without increasing the sectional area of the lower wiring conductor 11 (i.e., without increasing the width or thickness or both the width and thickness of the lower wiring conductor 11) and without any problem in terms of long-term reliability. In this manner, the induced intensities of magnetic fields generated in the storage layer 14 of each memory cell 10 by the currents flowing through the two wiring conductors 11 and 15 can be equalized.

Since there is no need to increase the sectional area of each lower wiring conductor 11, no unbalance occurs in the layout of the wiring conductors 11 and 15 and memory cells 10. Therefore, there arises no problem relating to the layout. That is, an optimized cell array design can be achieved.

If a plurality of lower wiring conductors 11 formed of copper and a plurality of upper wiring conductors 15 formed of aluminum are used at least for an matrix array of memory cells 10, the effect of the present invention is obtained. That is, in peripheral circuits for driving the matrix array of memory cells 10, both lower and upper wiring conductors are formed of the same conductive material (e.g., aluminum), as are those in the conventional wiring. However, the present invention is not limited to this arrangement.

For example, the same construction as the above-described construction of the matrix array of the memory cells 10 may also be used for the peripheral circuits for driving the matrix array of memory cells 10. This arrangement has the advantages of (i) increasing the degree of freedom of wiring layout and (ii) improving the operating performance of the entire MRAM as well as achieving the effect of the above-described embodiment.

Needless to say, while the lower wiring layer 11 and the upper wiring layer 15 are respectively formed of copper and aluminum in the above-described embodiment, the wiring materials in accordance with the present invention are not limited to them. Other materials may be used provided that the material of the lower wiring layer 11 is lower in specific resistance and higher in long-term reliability than the material of the upper wiring layer 15. For example, the lower wiring layer 11 is formed of a conductive material having copper as a major component (material having a copper content of 50% or more) (e.g., CuAl), while the upper wiring layer 15 is formed of a conductive material having aluminum as a major component (material having an aluminum content of 50% or more).

According to the gist of the present invention, in a case where the memory cell is formed so as to be symmetric about a lateral line and the positional relationship between the storage layer and the layer is reversed, that is, the storage layer is connected to the lower wiring while the layer is connected to the upper wiring, wiring materials may be selected such that the material of the upper wiring is higher in specific resistance and in long-term reliability than the material of the lower wiring. The same effect as that in the above-described embodiment can also be achieved in this manner.

As described above, in the nonvolatile magnetic storage device and the method of manufacturing the storage device, the induced intensities of magnetic fields generated in the storage layer in each memory cell by currents flowing through the two wiring conductors on the opposite sides of the memory cell can be made approximately equal to each other without any problem in terms of long-term reliability or layout. Also, the intensities of magnetic fields induced in the storage layer in the memory cell by the currents flowing through the two wiring conductors on the opposite sides of the memory cell can be made approximately equal to each other while maintaining the two wiring conductors in the state of being approximately equal to each other in sectional area. Further, an optimized memory cell array can be designed.

Figure 8:
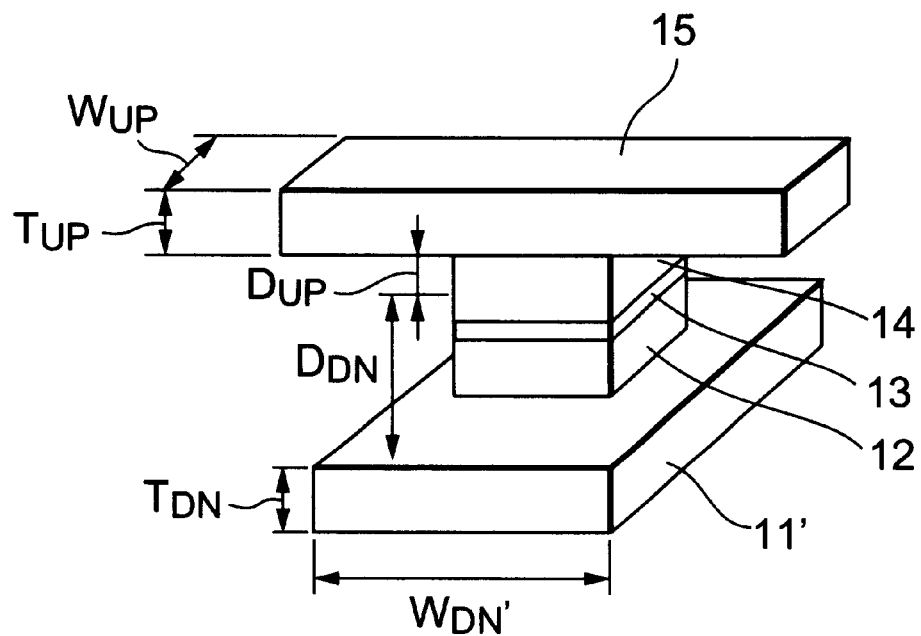
FIG. 8 is a schematic perspective view of the construction of a memory cell used in a MRAM in a second embodiment of the present invention.

FIG. 8 illustrates a magnetic memory cell of a second embodiment according to the present invention.

This cell is the same to the cell shown in FIG. 1 except a wiring conductor 11'. The wiring 11' is formed by the same material with the wiring 15 and has the same thickness Tup and Tdn. However, the width Wdn of the wiring 11' is waider than the width Wup of the wiring 15. The width of the wiring 11' is set to be able to flow a current larger about 2.5 times compared with the wring 15. By the feature, this embodiment can gain the same effect to the first embodiment.

Figure 9:
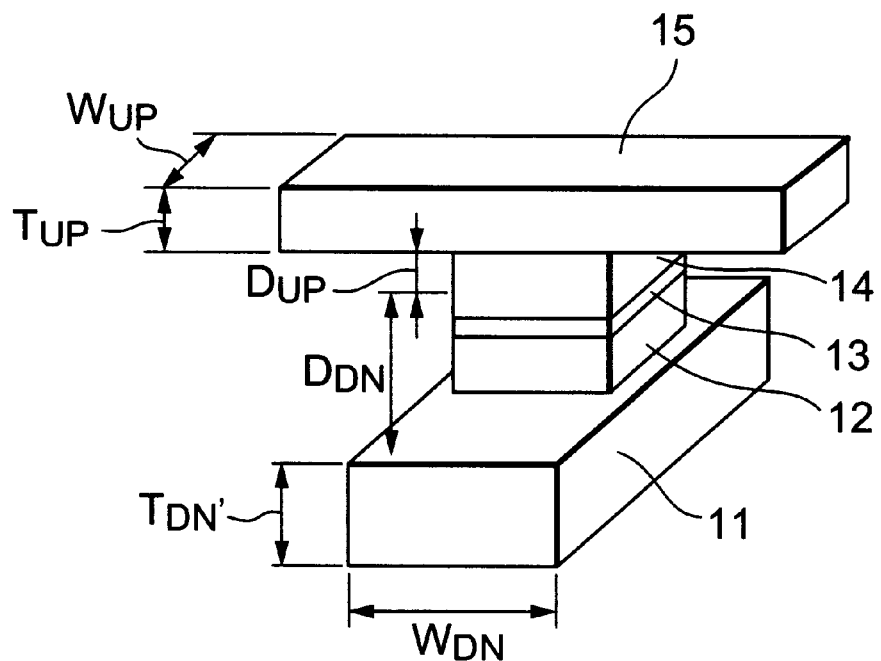
FIG. 9 is a schematic perspective view of the construction of a memory cell used in a MRAM in a third embodiment of the present invention.

FIG. 9 illustrates a magnetic memory cell of a third embodiment according to the present invention.

This cell is the same to the cell shown in FIG. 1 except a wiring conductor 11". The wiring 11" is formed by the same material with the wiring 15 and has the same width Wup and Wdn. However, the thickness Tdn' of the wiring 11' is thicker than the thickness Tup of the wiring 15. The thickness of the wiring 11' is set to be able to flow a current larger about 2.5 times compared with the wring 15. By the feature, this embodiment can gain the same effect to the first embodiment.

Figure 10A:
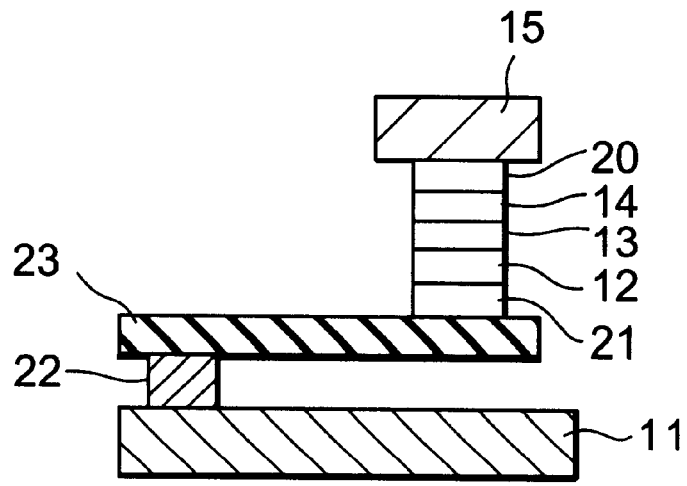
FIGS. 10A and 10B are sectional views of memory cells capable to be used in a MRAM according to the present invention.
Figure 10B:
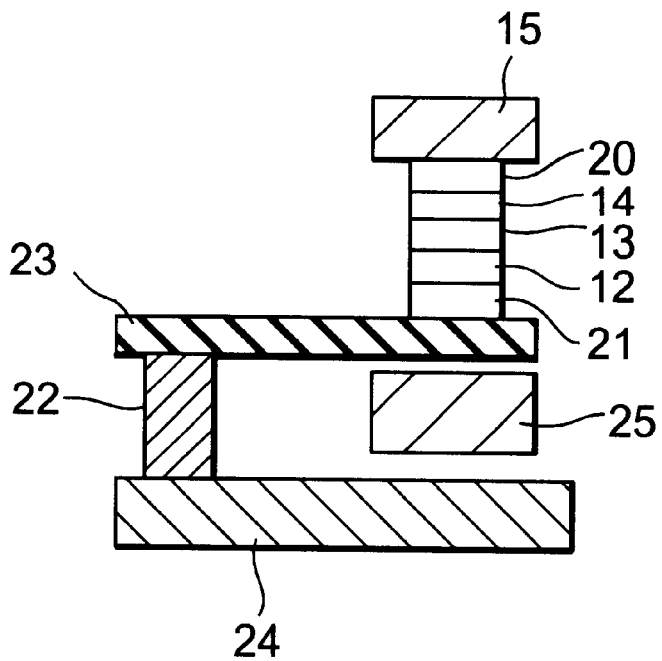

FIGS. 10A and 10B illustrates sectional views of other magnetic cells which is cable to adapt the present invention.

As to a magnetic memory cell in FIG. 10A, a first via plug 20 is inserted between the wiring 15 and the magnetic layer 14. Between the wiring 11 and the magnetic layer 12, a second via plug 21, a conductor 23 and a third via plug 22 are provided. The cell in FIG. 10A has the substantially square shape in as the same with the cell in FIG. 1. The wiring 11 is adopted the means by described in FIGS. 1, 8 and 9.

As to a magnetic memory cell in FIG. 10A, a first via plug 20 is inserted between the wiring 15 and the magnetic layer 14. Between the wiring 11 and the magnetic layer 24, a second via plug 21, a conductor 23 and a third via plug 22 are provided. The wiring 24 is a reading line which is used for reading out the stored data in the memory cell. A writing conductor 25 is inserted between the plug 21 and the wiring 24. The wiring 25 is used to write a data into the cell. The plug 21 and The cell in FIG. 10B has the substantially square shape in as the same with the cell in FIG. 1. The wiring 11 is adopted the means by described in FIGS. 1, 8 and 9.

Although the present invention has been described with reference to specific embodiments, this description is not meant to be construed in a limiting sense. Various modifications of the disclosed embodiments will become apparent to persons skilled in the art upon reference to the description of the invention. It is, therefore, contemplated that the appended claims will cover any modifications or embodiments as fall within the true scope of the present invention.

What is claimed is:

1. A magnetic memory device comprising:
    a plurality of first wiring conductors extending in a first direction and formed at a first layer level, said first wiring conductor having a first resistivity and a first reliability;
    a plurality of second wiring conductors extending in a second direction different from the first direction and formed at a second layer level, said second wiring conductor having a second resistivity lower than said first resistivity and a second reliability higher than said first reliabiity; and
    a plurality of magnetic memory cells placed at points of intersection of first wiring conductors and said second wiring conductors;
    each of said magnetic memory cells having a first ferromagnetic layer which is placed on the side of said first wiring conductor and in which the direction of magnetization is can be changed, a second ferromagnetic storage layer which is placed on the side of said second wiring conductor and in which the direction of magnetization fixed, and a non-ferromagnetic layer which is placed between said first and second ferromagnetic layers.

2. The device as claimed in claim 1, wherein said memory cell is a tunnel magnetoresistance (TMR) memory cell.

3. The device as claimed in claim 1, wherein said first wiring conductor includes aluminum as a major component and said second wiring conductor includes copper as a major component.

4. The device as claimed in claim 3, wherein binary information is reproduced from each of said memory cells by using the value of electrical resistance variable depending upon whether the direction of magnetization of said layer and the direction of magnetization of said storage layer are in parallel or inverse parallel with each other.

5. A magnetic memory device comprising:
    a first wiring conductor extending in a first direction and including copper as a major component;
    a second wiring conductor extending in a second direction different from the first direction and including aluminum as a major component; and
    a magnetic memory cell coupled between said first and second wiring conductors, said cell having a pinned ferromagnetic layer arranged close to said first wiring conductor and apart to said second wiring conductor, a free ferromagnetic layer arranged close to said second wiring conductor and apart to said first wiring conductor, and a non magnetic layer placed between said pinned and free ferromagnetic layers.

6. The device as claimed in claim 5, wherein said cell is a TMR cell.

7. A magnetic memory device comprising:
    a first wiring layer;
    a second wiring layer different from said first wiring layer; and
    a magnetic memory cell arranged between said first and second wiring layers, said memory cell having a first magnetic film coupled to said first wiring layer, a second magnetic film coupled to said second wiring layer and a non-magnetic film sandwiched between said first and second magnetic films,
    wherein said first wiring layer has a first width and a first length in its cross section and includes a first material as a major component, and said second wiring layer has a second width and a second length in its cross section and includes a second material as a major component.

8. The device as claimed in claim 7, wherein said first length is substantially the same to said second length, said first width is substantially the same to said second width, said first material is different from said second material.

9. The device as claimed in claim 8, wherein said first material is copper and said second material is aluminum.

10. The device as claimed in claim 9, wherein each shape of said first and second magnetic films and non-magnetic films is substantially square.

11. The device as claimed in claim 10, wherein said first magnetic film is a pinned film and said second magnetic film is a free film.

12. The device as claimed in claim 7, said first material is the same to said second material and one of said first width and length is larger than one of said second width and length.

13. The device as claimed in claim 12, wherein said first width is larger than said second width and said first length is the same to said second length.

14. The device as claimed in claim 12, wherein said first length is larger than said second length and said first width is the same to said second width.

15. A magnetic memory device comprising:
    a first wiring layer;
    a second wiring layer different from said first wiring layer; and
    a magnetic memory cell arranged between said first and second wiring layers, said memory cell having a first magnetic film coupled to said first wiring layer, a second magnetic film coupled to said second wiring layer and a non-magnetic film sandwiched between said first and second magnetic films,
    wherein maximum current volume of said first wiring layer is larger by about 2.5 times than that of said second wiring layer.

16. A magnetic memory device comprising:
    a first wiring conductor having a first resistivity and able to flow a first wiring current;
    a second wiring conductor having a second resistivity and able to flow a second wiring current; and
    a magnetic memory cell located between said first and second wiring conductors, said cell having a pinned magnetic film, a free magnetic film and a non-magnetic film, wherein said first wiring current is larger than said second wiring current when a write data is written into said cell.

17. The device as claimed in claim 16, wherein said first resistivty is the same to said second resistivity.

18. The device as claimed in claim 16, wherein said first resistivity is different from said second resistivity.

19. The device as claimed in claim 16, wherein said first wiring conductor is close to said pinned layer and apart from said free layer, said second wiring conductor is close to said free layer and apart from said pinned layer.

* * * * *